United States Patent [19]
Akkermans

[11] Patent Number: 4,873,524
[45] Date of Patent: Oct. 10, 1989

[54] DECODING UNIT FOR CMI-ENCODED SIGNALS

[75] Inventor: Gerardus P. M. Akkermans, Hilversum, Netherlands

[73] Assignee: AT&T and Philips AT&T Philips Telecommunications B.V., Hilversum, Netherlands

[21] Appl. No.: 169,679

[22] Filed: Mar. 18, 1988

[30] Foreign Application Priority Data

Mar. 27, 1987 [NL] Netherlands .................... 8700720

[51] Int. Cl.⁴ .................................... H03M 5/14
[52] U.S. Cl. .................................... 341/73; 360/44
[58] Field of Search ............... 341/50, 68, 73; 360/39, 360/40, 41, 44

[56] References Cited

U.S. PATENT DOCUMENTS

| | | | |
|---|---|---|---|
| 3,961,367 | 6/1976 | Wu | 360/44 |
| 4,410,877 | 10/1983 | Carasso et al. | 360/44 |
| 4,808,970 | 2/1989 | Arnaune | 341/73 |

FOREIGN PATENT DOCUMENTS 3335517  4/1985  Fed. Rep. of Germany ........ 341/73

Primary Examiner—William M. Shoop, Jr.
Assistant Examiner—Brian K. Young
Attorney, Agent, or Firm—L. C. Canepa

[57] ABSTRACT

Decoding unit for CMI-encoded input signals. A signal having 0/1 transitions is first derived from a signal. A 0/1 transition occurs in a CMI-signal as the result of encoding a binary zero or two consecutive binary ones. In the latter case the 0/1 transition is preceded two bits earlier by a 1/0 transition. By deriving a signal having 1/0 transitions, delaying this signal by two bit intervals and by comparing it to the first signal, the 0/1 transitions corresponding to a binary zero are then accurately detected. The resultant signal can easily be extended by one bit period, so that independent of any phase inversions of the read clock, the appropriate binary information is always generated.

5 Claims, 2 Drawing Sheets

DECODING UNIT FOR CMI-ENCODED SIGNALS

BACKGROUND OF THE INENTION

The invention relates to a decoding unit for CMI-encoded input signals having an input and an output, the input of the decoding unit being coupled via a time delay stage to a first input of a first gate circuit a second input of which is connected to the input of the decoding unit, the output of the gate circuit being coupled to the output of the decoding unit.

In a digital multiplex transmission system of the type described in, for example, Netherlands Patent Application No. 8203110, a digital signal is applied at the transmitter end to a CMI-encoding unit in which the digital signal is converted into the CMI-code format (coded mark inversion) recommended for the bit rate. The CMI-code is a two-level code, in which a logic 0 bit is encoded such that each of the two levels is present during half a bit time interval, first one and then the other level. A logic 1 bit is encoded by one of the two levels during an entire bit interval, more specifically such that the level alternates for consecutive logic 1 bits. At the receiver of the CMI-interface the digital channel includes a CMI decoding unit in which, after equalization and regeneration with the aid of the recovered system clock, the received CMI-encoded signal is converted into the normal binary code. The original composite digital signal with the nominal bit rate and the original system clock are then available at the output of the CMI-decoding unit.

In current decoding units of the above-defined type, as, for example, disclosed in the European patent application No. 0,208,558, the time delay stage is constituted by a bistable element producing a delay of half a bit interval. The gate circuit is constituted by an exclusive-OR gate. The CMI-encoded input signal and the delayed version thereof are each applied to an input of the exclusive-NOR gate. The output signal of the exclusive-NOR gate contains the appropriate information as regards the binary data during the second half of each bit interval. In the first half of each bit interval the data then occurring is undefined and assumes at random one of the logic values 0 or 1.

Often, from the point of view of bandwidth limitation, the exclusive NOR gate output signal is applied to the D-input of a D-flip-flop to whose clock input a read clock signal is applied. Since in the first half of each bit interval the data then occurring is undefined, it is necessary for the read clock signal to be word-synchronous with the 2-bit words in the CMI-encoded input signal. This has the disadvantage that an additional synchronizing circuit is required to realise this.

SUMMARY OF THE INVENTION

The invention has for its object to provide a solution of the problem mentioned in the foregoing, and is characterized, in that the time delay stage comprises the series arrangement of first, second and third delay elements, that the first input of the first gate circuit is connected to the output of a second gate circuit an input of which is connected to the output of the third time delay element and another input of which is connected to the output of the second delay element, and that a third input of the first gate circuit is connected to the output of the first time delay element.

BRIEF DESCRIPTION OF THE DRAWINGS

The invention and its advantages will now be described in greater detail with reference to the accompanying drawing.

DESCRIPTION OF THE PREFERRED EMBODIMENTS

Figure 1:
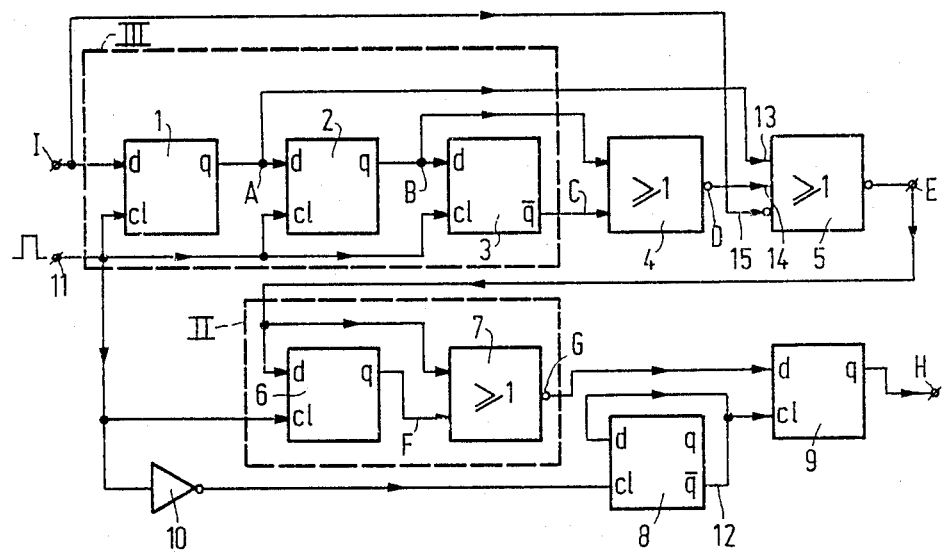
FIG. 1 shows a possible embodiment of the decoding unit according to the invention.

In the embodiment of FIG. 1, the input I of the decoding unit is connected to the input of a time delay stage III, which comprises the series arrangement of a first delay element 1, a second delay element 2 and a third delay element 3. The output C of the delay stage III is connected to an input of the second gate circuit 4 a further input of which is connected to the output B of the second delay element 2. The output D of the second gate circuit 4 is connected to the first input 14 of the first gate circuit 5. The input I of the decoding unit is connected to the inverting, second input 15 of the gate circuit 5. The third input 13 of the gate circuit 5 is connected to the output A of the first delay element 1. The delay elements 1, 2 and 3 are constituted by D-flip-flops, whose clock signal inputs are jointly connected to the clock signal input 11 of the decoding unit. The first gate circuit 5 and the second gate circuit 4 are formed by NOR-gates. The output E of the NOR-gate 5 is connected to the output H of the decoder unit via the series arrangement of a pulse stretcher II and a bistable element 9. The pulse stretcher II includes the series arrangement of a bistable element 6 and a NOR-gate 7. The signal input d of the bistable element 6 and an input of the NOR-gate 7 are connected to the output E of the NOR-gate 5. The output F of the bistable element 6 is connected to a further input of the NOR-gate 7. The bistable element 6 is preferably a D-type flip-flop. The output G of the NOR gate 7 is connected to the input d of the D-flip-flop 9, whose output 9 is connected to the output H of the decoder unit. The clock input of the flip-flop 9 is connected to the clock input 11 of the decoder unit via the series arrangement of an inverter 10 and a D-flip-flop 8 which is arranged as a divide-by-two divider.

Figure 2:
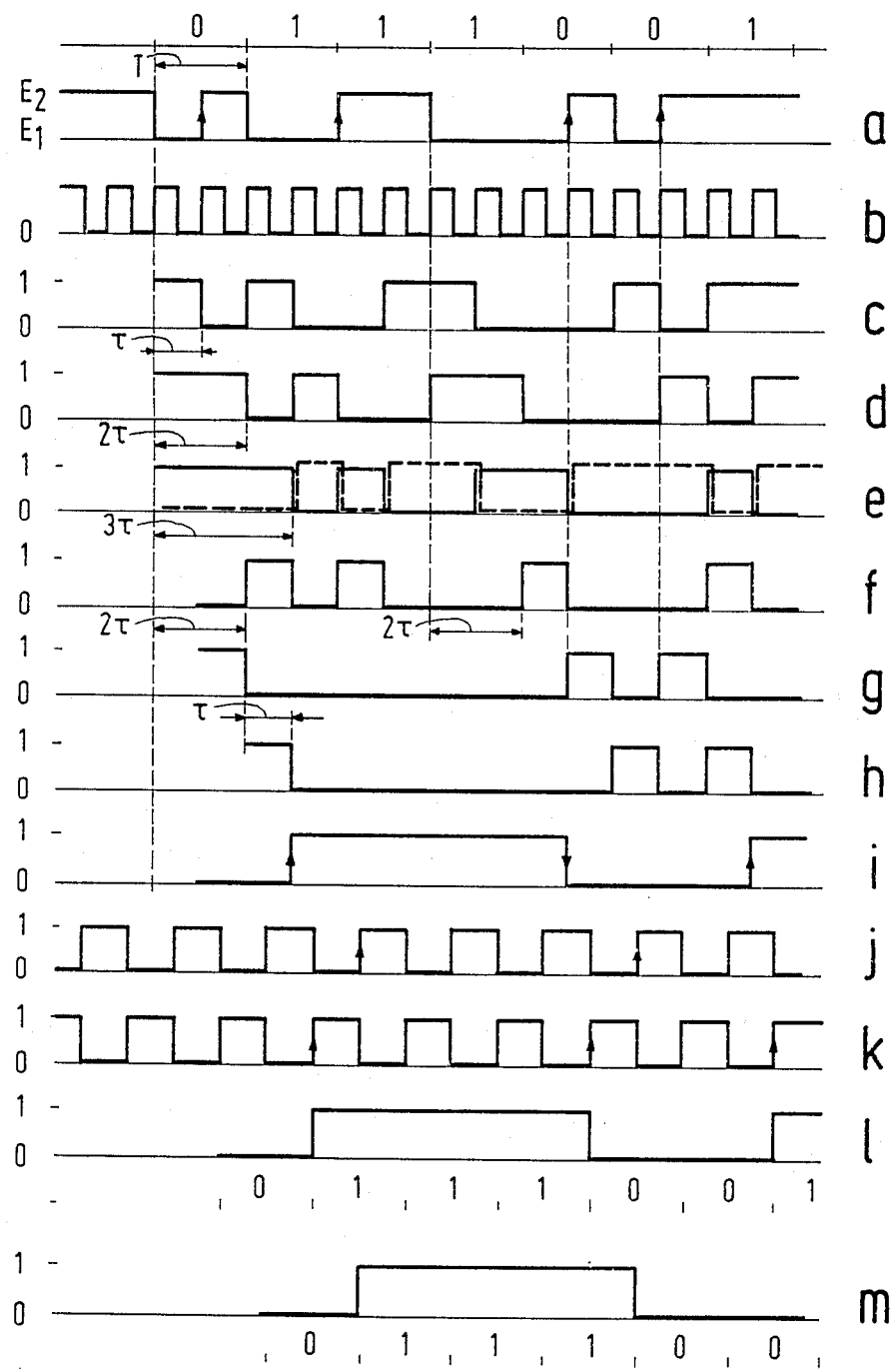
FIG. 2 shows time-sequence diagrams to explain the operation of the decoding unit of FIG. 1.

FIG. 2a illustrates how the conversion of a binary signal having logic 1-bits and logic 0-bits into a CMI-encoded signal is effected. The CMI-code is a 2-level code in which a logic 0 bit is encoded such that each of the two levels $E_1$ and $E_2$ is present during half a bit interval T, first $E_1$ and thereafter $E_2$. A logic 1 bit is encoded by one of the two levels $E_1$ or $E_2$ during an entire bit interval T, more specifically such that the level is alternated for consecutive logic 1-bits. In the further time sequence diagrams of FIG. 2 $E_1$ is chosen equal to 0.

From a further, careful examination of FIG. 2a it will be apparent that a binary zero is encoded as a 0/1 ($E_1$/$E_2$) transition. A further 0/1 transition can only occur at the interface of two encoded ones. In that case the first one is encoded as a 0/0 signal which is then preceded by either an encoded zero (0/1) or an encoded one (1/1). If now a check is made to see whether a 1/0 transition, which precedes a 0/1 transition by a bit interval, is present, an encoded zero and a sequence of encoded ones can be differentiated.

The CMI-encoded input signal is delayed by 3 bit intervals by means of the three flip-flops 1, 2 and 3 which are clocked by a read clock signal as shown in FIG. 2b. The information delayed by one bit interval $\tau$ is available at the point A of the decoder unit, see FIG. 2c. The information delayed by two bit intervals $2\tau$ are available at the point B of the decoder unit, see FIG. 2d. The signal delayed by 3 bit intervals $3\tau$ is present at the point C of the decoder unit, see FIG. 2e. The information in accordance with FIG. 2d and the inverted information in accordance with FIG. 2e, see broken line, are applied to the inputs of the NOR-gate 4. The output of this gate 4 is in the high state only when the input signals of this gate are equal to zero. This is the case at the instants indicates in FIG. 2f. When the output D of the gate 4 is in the high state, this implies that two bit intervals $2\tau$ earlier a 1/0 transition was present in the applied CMI-encoded input signal. This is illustrated in FIG. 2f for two 1/0 transitions.

The information of FIG. 2f is applied together with the information of FIG. 2e and the inverted CMI-encoded input signal of FIG. 2a, to the inputs of the NOR-gate 5. The output of this gate 5 is high only when all the input signals of this gate 5 are equal to zero. This is the case at the instants indicated in FIG. 2g. When the output E of the gate 5 is in the high state this implies that a 0/1 transition has occurred which was not preceded two bit intervals $2\tau$ earlier by a 1/0 transition. See, for example, the two last 0/1 transitions in the signal of FIG. 2a in combination with the fact that the signal shown in FIG. 2g is in the high state. The signal present at point E of the decoding unit, see FIG. 2g is delayed by one bit interval with the aid of the flip-flop 6. The signal present at the point E and the delayed signal at the output of the flip-flop 6 are combined with the aid of the NOR-gate 7, see FIG. 2i. The fully encoded binary signal is now present at the output G of this gate 7.

The binary signal present in the point G of the decoding unit, see FIG. 2i, is once again entered into a flip-flop 9 at an appropriate clock signal, so that a fixed relationship is produced between the outgoing binary signal and the read clock signal. Since the read clock signal, see FIGS. 2j and 2k is generated with the aid of a divide-by-two divider 8, which is clocked with the inverted read clock signal of FIG. 2b, the active edge of the read clock signal is always contained within the stable period of the signal of FIG. 2i. The signal transitions in the binary signal of FIG. 2i have already occurred before the active edges occur, see the arrows in FIG. 2j and 2k. When a read clock signal as shown in FIG. 2j is used, a binary output signal illustrated in FIG. 2m is produced at the output H of the decoding unit. When a read clock signal as illustrated in FIG. 2k is used, a binary output signal in accordance with FIG. 2l is produced at the output H of the decoding unit.

Instead of flip-flops, it is alternatively possible to use other types of delay elements such as electrically conducting conductors, cables or microstrips, depending on the frequency range in which the decoding unit is operative. The decoding unit is perfectly suitable for integration in a monolithic IC.

What is claimed is:

1. A decoding unit for CMI-encoded input signals having an input and an output, the input of the decoding unit being coupled via a time delay stage to a first input of a first gate circuit a second input of which is connected to the input of the decoding unit, the output of the gate circuit being coupled to the output of the decoding unit, characterized in that the time delay stage comprises a series arrangement of first, second and third delay elements, that the first input of the first gate circuit is connected to the output of a second gate circuit an input of which is conneted to the output of the third delay element and another input of which is connected to the output of the second delay element, and that a third input of the first gate circuit is connected to the output of the first delay element.

2. A decoder unit as claimed in claim 1, characterized in that the delay elements are constituted by bistable circuits and that the first and second gate circuits are constituted by NOR gates.

3. A decoding unit as claimed in claim 1 or 2, characterized in that the output of the first gate circuit is coupled to the output of the decoder unit by a pulse stretcher.

4. A decoder unit as claimed in claim 3, characterized in that the output of the pulse stretcher is connected to the output of the decoder unit via a bistable element, that the clock input of the bistable element is connected to the clock signal input of the decoder unit via the series arrangement of an inverter and a divide-by-two divider.

5. A decoder unit as claimed in claim 4, characterized in that the pulse stretcher includes the series arrangement of a bistable element and a NOR gate, the signal input of the bistable element and an input of the NOR gate being connected to the output of the first gate circuit and the output of the bistable element being connected to a further input of the NOR gate.

* * * * *